(12) United States Patent
Koshii

(10) Patent No.: US 11,465,531 B2
(45) Date of Patent: Oct. 11, 2022

(54) BATTERY DIAGNOSTIC DEVICE, BATTERY DIAGNOSTIC METHOD, BATTERY DIAGNOSTIC PROGRAM, AND VEHICLE

(71) Applicant: TOYOTA JIDOSHA KABUSHIKI KAISHA, Toyota (JP)

(72) Inventor: Takaya Koshii, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/157,036

(22) Filed: Jan. 25, 2021

(65) Prior Publication Data
US 2021/0300205 A1 Sep. 30, 2021

(30) Foreign Application Priority Data
Mar. 25, 2020 (JP) .............................. JP2020-054865

(51) Int. Cl.
| | |
|---|---|
| *B60L 58/12* | (2019.01) |
| *G01R 31/389* | (2019.01) |
| *G01R 31/396* | (2019.01) |
| *H01M 10/44* | (2006.01) |
| *G01R 31/392* | (2019.01) |

(52) U.S. Cl.
CPC ............ *B60L 58/12* (2019.02); *G01R 31/389* (2019.01); *G01R 31/396* (2019.01); *H01M 10/443* (2013.01); *G01R 31/392* (2019.01)

(58) Field of Classification Search
CPC .... B60L 58/12; B60L 58/16; B60L 2240/545; B60L 2240/547; B60L 3/12; G01R 31/389; G01R 31/396; G01R 31/392; G01R 31/3842; H01M 10/443; Y02E 60/10; Y02T 10/70

See application file for complete search history.

(56) References Cited

U.S. PATENT DOCUMENTS

| | | | | |
|---|---|---|---|---|
| 6,987,377 B2 * | 1/2006 | Sakakibara | ........... | H02J 7/0047 320/132 |
| 10,180,461 B2 * | 1/2019 | Wada | .................... | G01R 31/389 |
| 10,209,317 B2 * | 2/2019 | Ohkawa | .............. | G01R 31/3842 |
| 2009/0130538 A1 * | 5/2009 | Kaita | .................... | G01R 31/374 429/61 |
| 2010/0250038 A1 | 9/2010 | Morita et al. | | |
| 2015/0145521 A1 * | 5/2015 | Koba | .................. | H01M 10/443 29/593 |
| 2016/0097819 A1 * | 4/2016 | Ohkawa | ............... | G01R 31/389 324/430 |

FOREIGN PATENT DOCUMENTS

| | | | | |
|---|---|---|---|---|
| JP | 2010-236925 A | 10/2010 | | |
| WO | WO 2007/132729 | * 11/2007 | .............. | B60L 58/26 |

* cited by examiner

Primary Examiner — Tung S Lau
(74) Attorney, Agent, or Firm — Oliff PLC

(57) ABSTRACT

A battery diagnostic device includes: an acquisition unit that acquires a temperature and an internal resistance of a battery; a determination unit that determines a diagnostic temperature that is a temperature used for a diagnosis of the battery, based on the temperature acquired by the acquisition unit; an estimation unit that estimates the internal resistance of the battery at the diagnostic temperature based on the temperature and the internal resistance acquired by the acquisition unit and the diagnostic temperature determined by the determination unit; and a diagnosis unit that diagnoses the battery based on the internal resistance estimated by the estimation unit.

6 Claims, 8 Drawing Sheets

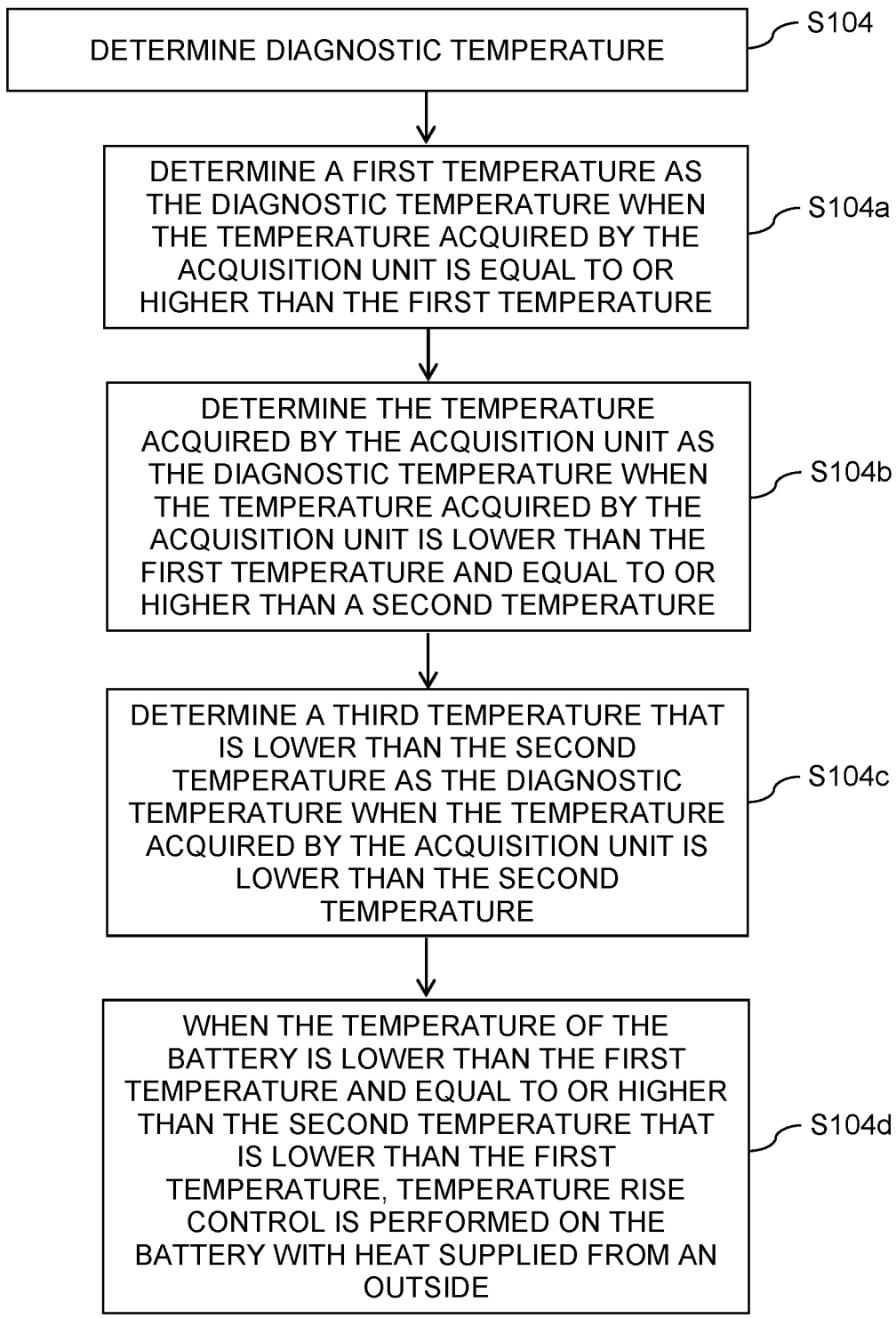

BATTERY DIAGNOSTIC DEVICE, BATTERY DIAGNOSTIC METHOD, BATTERY DIAGNOSTIC PROGRAM, AND VEHICLE

CROSS-REFERENCE TO RELATED APPLICATION

This application claims priority to Japanese Patent Application No. 2020-054865 filed on Mar. 25, 2020, incorporated herein by reference in its entirety.

BACKGROUND

1. Technical Field

The present disclosure relates to a battery diagnostic device and the like for diagnosing a battery mounted on a vehicle.

2. Description of Related Art

Batteries (secondary batteries) such as lithium ion batteries are diagnosed based on internal resistance. In this regard, Japanese Unexamined Patent Application Publication No. 2010-236925 (JP 2010-236925 A) discloses a technique that acquires the temperature and the resistance value of the secondary battery, estimates the internal resistance value of the secondary battery at a specific temperature based on a predetermined model, and uses the internal resistance value for performance diagnosis at the temperature.

SUMMARY

When the difference between the temperature of the secondary battery when the internal resistance is acquired and the temperature used for diagnosis is relatively large, the estimation accuracy of the estimated value of the internal resistance at the temperature used for the diagnosis may decrease due to an internal resistance acquisition error when estimating the internal resistance based on the model, and the diagnostic accuracy of the performance diagnosis may also decrease.

An object of the present disclosure is to provide a battery diagnostic device having high diagnostic accuracy.

An aspect of the present disclosure for solving the above issue is a battery diagnostic device including: an acquisition unit that acquires a temperature and an internal resistance of a battery; a determination unit that determines a diagnostic temperature that is a temperature used for a diagnosis of the battery, based on the temperature acquired by the acquisition unit; an estimation unit that estimates the internal resistance of the battery at the diagnostic temperature based on the temperature and the internal resistance acquired by the acquisition unit and the diagnostic temperature determined by the determination unit; and a diagnosis unit that diagnoses the battery based on the internal resistance estimated by the estimation unit.

According to the present disclosure, it is possible to improve the estimation accuracy of the internal resistance and thus improve the diagnostic accuracy of the battery by determining the temperature used for the diagnosis based on the temperature of the battery and using it for estimating the internal resistance.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein:

FIG. 9 is a flowchart showing an example of a battery diagnostic sub-process according to the embodiment.

DETAILED DESCRIPTION OF EMBODIMENTS

Embodiment

In a battery diagnostic device according to an embodiment of the technique described in the present disclosure, for example, a different diagnostic temperature is determined for each assumed temperature change pattern based on the temperature of the battery to be diagnosed and is used for estimating the internal resistance, which improves the estimation accuracy. This can improve the reliability of battery diagnosis.

Configuration

Figure 1:
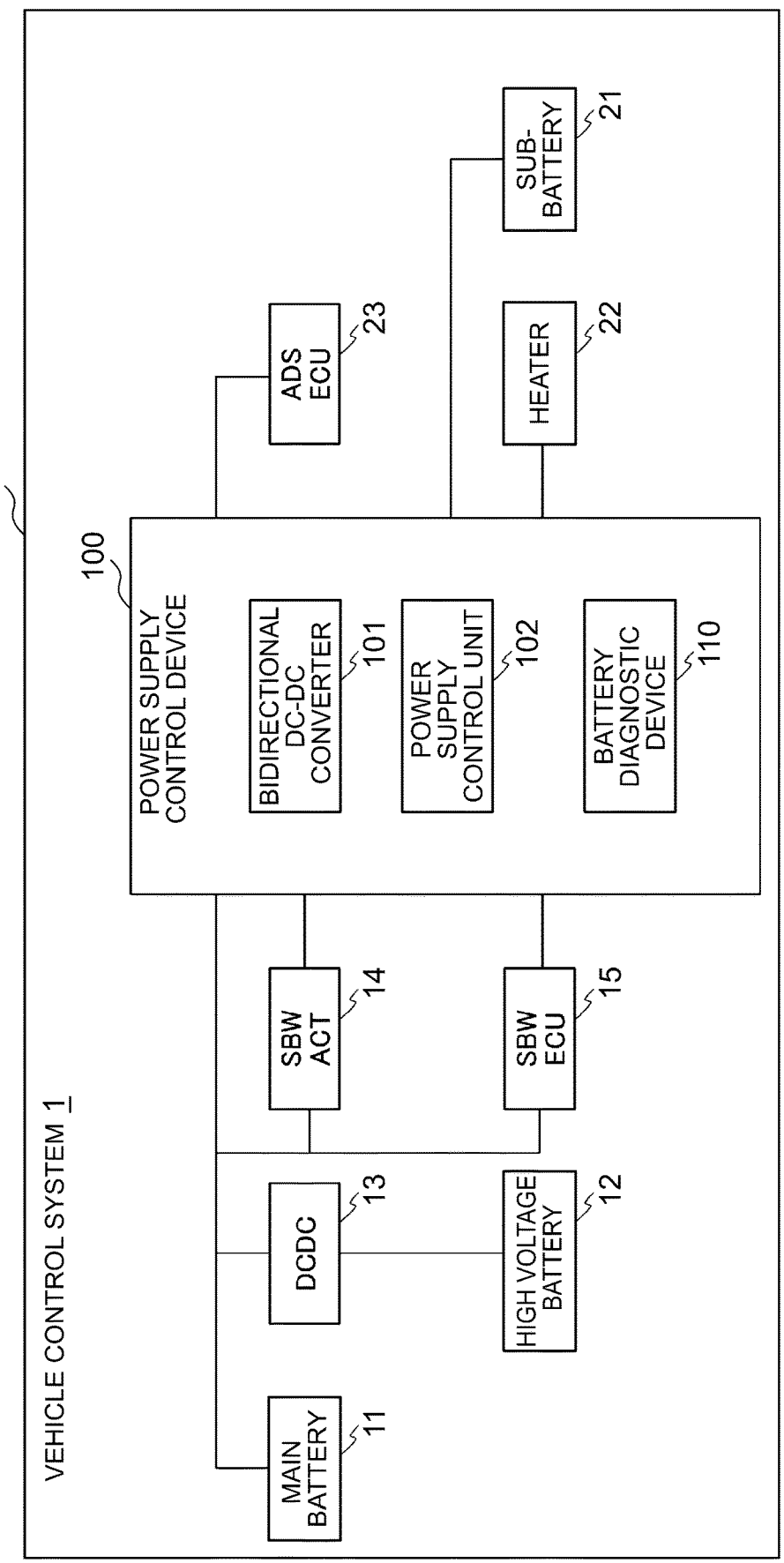
FIG. 1 is a configuration diagram of a vehicle control system according to an embodiment.

FIG. 1 is a diagram showing a configuration example of a vehicle control system 1 mounted on a vehicle 200 according to an embodiment of the technique described in the present disclosure.

A main battery 11, a high voltage battery 12, and a direct current-to-direct current (DC-DC) converter 13 constitute a main power supply system. The main battery 11 is, for example, a lead acid battery.

A sub-battery 21 constitutes a sub-power supply system. The sub-power supply system is a backup system to be used in case of a failure of the main power supply system described above. A heater 22 can raise the temperature of the sub-battery 21. The sub-battery 21 is, for example, a lithium ion battery.

An SBW ACT 14 is an actuator that controls the shift position, and in particular, can set the shift position to the parking position to perform parking lock. An SBW ECU 15 is an electronic control unit (ECU) that controls the SBW ACT 14. The SBW ECU 15 controls the SBW ACT 14 to electrically control the shift position (shift-by-wire control).

An ADS ECU 23 is an ECU that executes the function of the automated driving system.

A power supply control device 100 includes a bidirectional DC-DC converter 101, a power supply control unit 102, and a battery diagnostic device 110, and can control power supply to the actuator and the ECUs described above and can perform performance diagnosis of the sub-battery 21. Each function of the power supply control unit 102 and the battery diagnostic device 110 is executed by a control unit including a processor and a memory. The number of control units is not limited, and each function of the power supply control unit 102 and the battery diagnostic device 110 may be executed by one control unit or may be executed individually by different control units.

The vehicle control system 1 may include various ECUs and actuators in addition to those described above.

Here, an example of control of the power supply control device 100 will be described. The power supply control unit 102 of the power supply control device 100 monitors values of a current sensor and a voltage sensor (not shown) provided in each part of the vehicle control system 1 to detect whether the main power supply system is normal or has failed, and appropriately controls a plurality of switches such as relays (not shown) appropriately provided inside and outside of the power supply control device 100 to perform the following power supply control.

Figure 2:
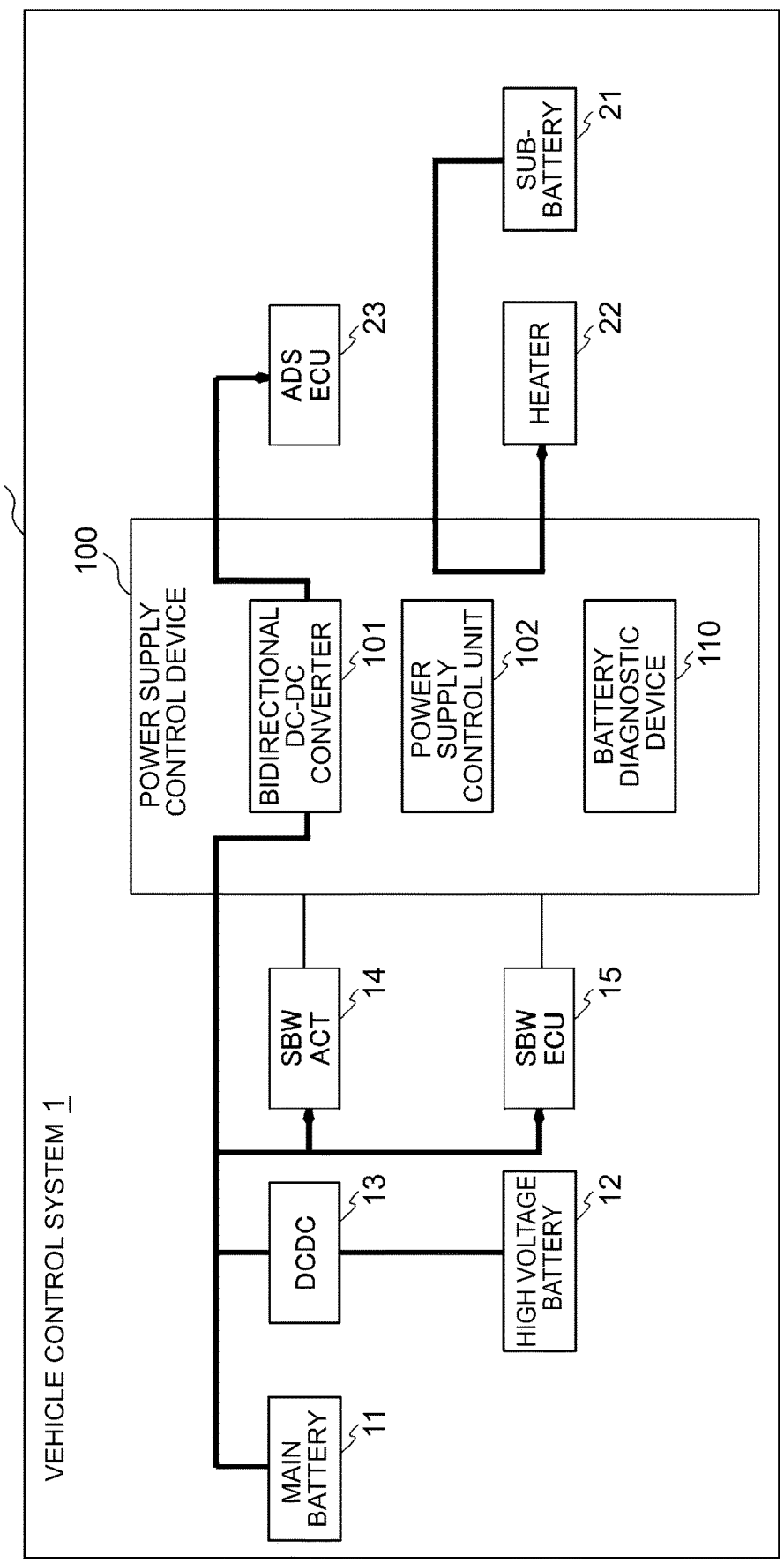
FIG. 2 is a diagram showing an example of power supply control according to the embodiment.

FIG. 2 shows an example of the power supply control during autonomous driving when the main power supply system operated by the power supply control unit 102 is normal. In this case, the power supply control unit 102 supplies the output power of the main battery 11 and the output power of the high voltage battery 12 whose voltage has been stepped down by the DC-DC converter 13 to the SBW ACT 14, the SBW ECU 15, the ADS ECU 23, and the like.

The temperature of the sub-battery 21 is measured by a temperature sensor (not shown) provided in the sub-battery 21. When the temperature of the sub-battery 21 is lower than a first temperature T1 and equal to or higher than a second temperature T2 that is lower than the first temperature T1, the power supply control unit 102 supplies the output power of the sub-battery 21 to the heater 22 and raises the temperature of the sub-battery 21 to improve power characteristics of the sub-battery 21 such as the voltage and a state of charge. When the temperature of the sub-battery 21 is lower than the second temperature, the power characteristics cannot be expected to be sufficiently improved based on the temperature rise of the sub-battery 21, so that the output power of the sub-battery 21 is not supplied to the heater 22 and the temperature of the sub-battery 21 is not raised. The power supply control unit 102 may appropriately supply the output power of the main battery 11 or the high voltage battery 12 to the sub-battery 21 via the bidirectional DC-DC converter 101 to charge the sub-battery 21. Further, the power supply control unit 102 applies the output voltage of the sub-battery 21 to the ADS ECU 23, but controls the bidirectional DC-DC converter 101 to suppress the power supply from the sub-battery 21.

Figure 3:
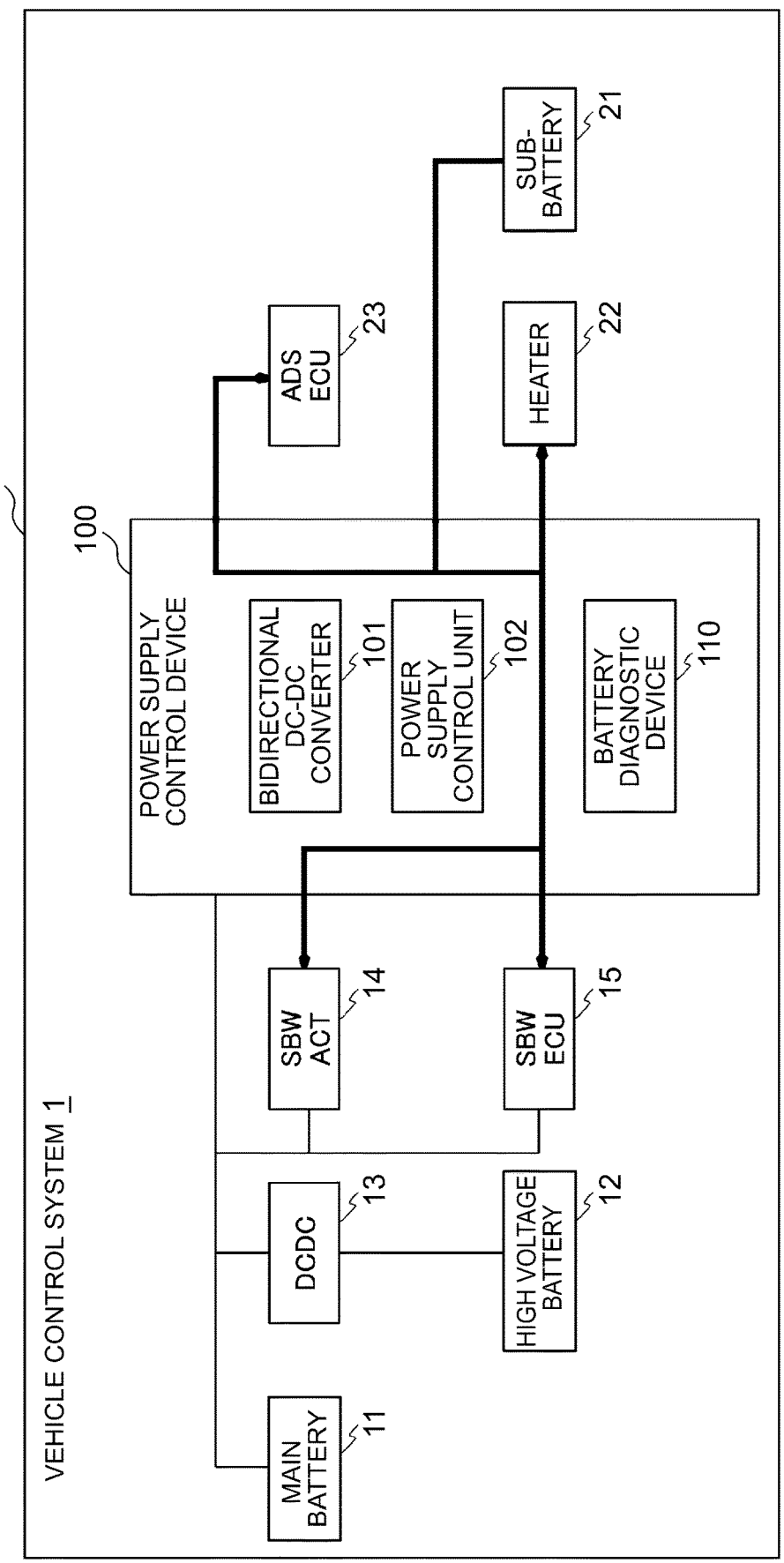
FIG. 3 is a diagram showing an example of the power supply control according to the embodiment.

FIG. 3 shows an example of the power supply control performed by the power supply control unit 102 when the main power supply system fails during autonomous driving. In this case, the power supply control unit 102 supplies the output power of the sub-battery 21 to the SBW ACT 14, the SBW ECU 15, the ADS ECU 23, and the like. The power supply from the sub-battery 21 to the heater 22 is performed in the same manner as described above. In this state, the ADS ECU 23 performs limp home control for stopping the vehicle 200 promptly and safely, and after the vehicle 200 stops, the SBW ACT 14 and the SBW ECU 15 perform the parking lock. Even when the main power supply system fails during manual driving, the power supply control unit 102 supplies the output power of the sub-battery 21 to the SBW ACT 14 and the SBW ECU 15, and after the vehicle 200 stops, the SBW ACT 14 and the SBW ECU 15 perform the parking lock.

Figure 4:
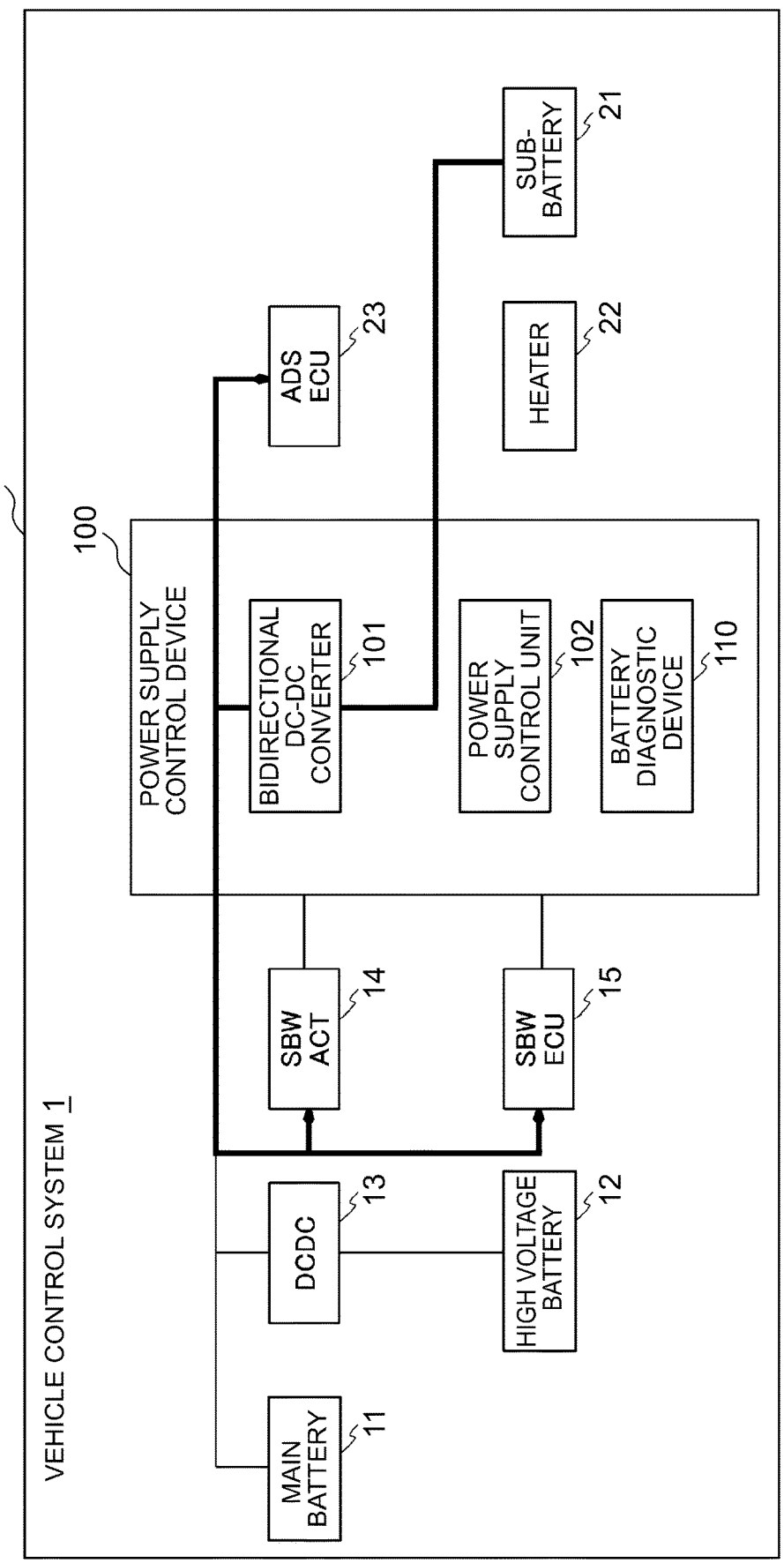
FIG. 4 is a diagram showing an example of discharge control according to the embodiment.

FIG. 4 shows an example of discharge control for acquiring internal resistance by the battery diagnostic device 110. The battery diagnostic device 110 appropriately controls a plurality of switches such as relays (not shown) appropriately provided inside and outside of the power supply control device 100, and discharges power from the sub-battery 21 while restricting a discharge voltage and a discharge current by the bidirectional DC-DC converter 101. The discharged power is appropriately consumed by the load of the ECUs, the actuators, and the like.

Diagnostic Process

Figure 5:
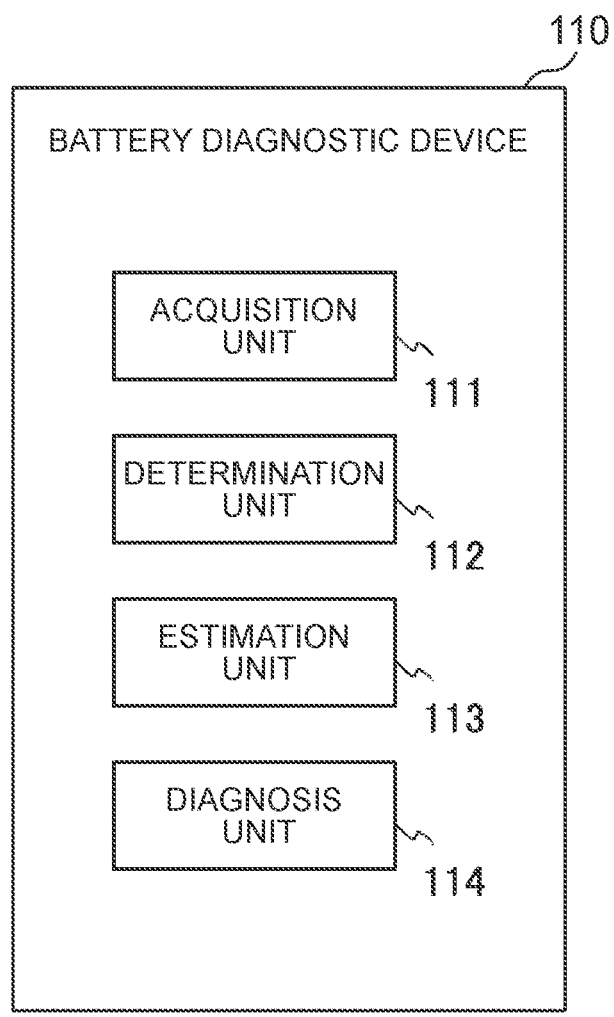
FIG. 5 is a functional block diagram of a battery diagnostic device according to the embodiment.

FIG. 5 shows a functional block diagram of the battery diagnostic device 110. The battery diagnostic device 110 includes an acquisition unit 111, a determination unit 112, an estimation unit 113, and a diagnosis unit 114.

The acquisition unit 111 acquires the temperature and the internal resistance of the sub-battery 21. The determination unit 112 determines the diagnostic temperature, which is the temperature used for the diagnosis of the sub-battery 21, based on the temperature acquired by the acquisition unit 111. The estimation unit 113 estimates the internal resistance of the sub-battery 21 at the diagnostic temperature based on the temperature and the internal resistance acquired by the acquisition unit 111 and the diagnostic temperature determined by the determination unit 112. The diagnosis unit 114 diagnoses the sub-battery 21 based on the internal resistance estimated by the estimation unit 113.

Figure 6:
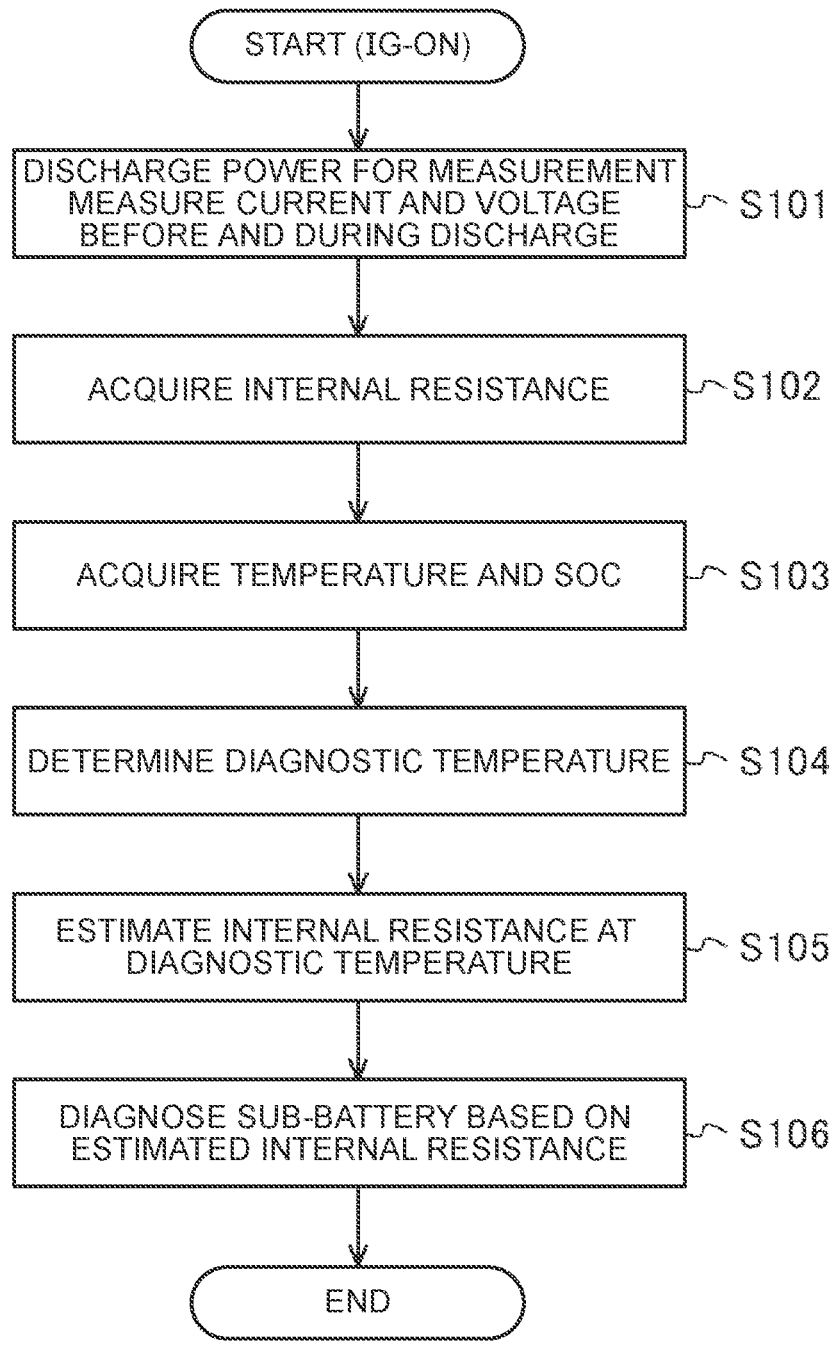
FIG. 6 is a flowchart showing an example of a battery diagnostic process according to the embodiment.

FIG. 6 shows a flowchart of the battery diagnostic process performed by the battery diagnostic device 110, and the process will be described according to the flowchart. This process is executed at a timing before the vehicle starts traveling, before other operations of the vehicle control system 1 are started, and when the power discharge of the sub-battery 21 can be relatively stably performed, such as a timing immediately after the ignition is turned on (power on).

Step S101

Figure 7:
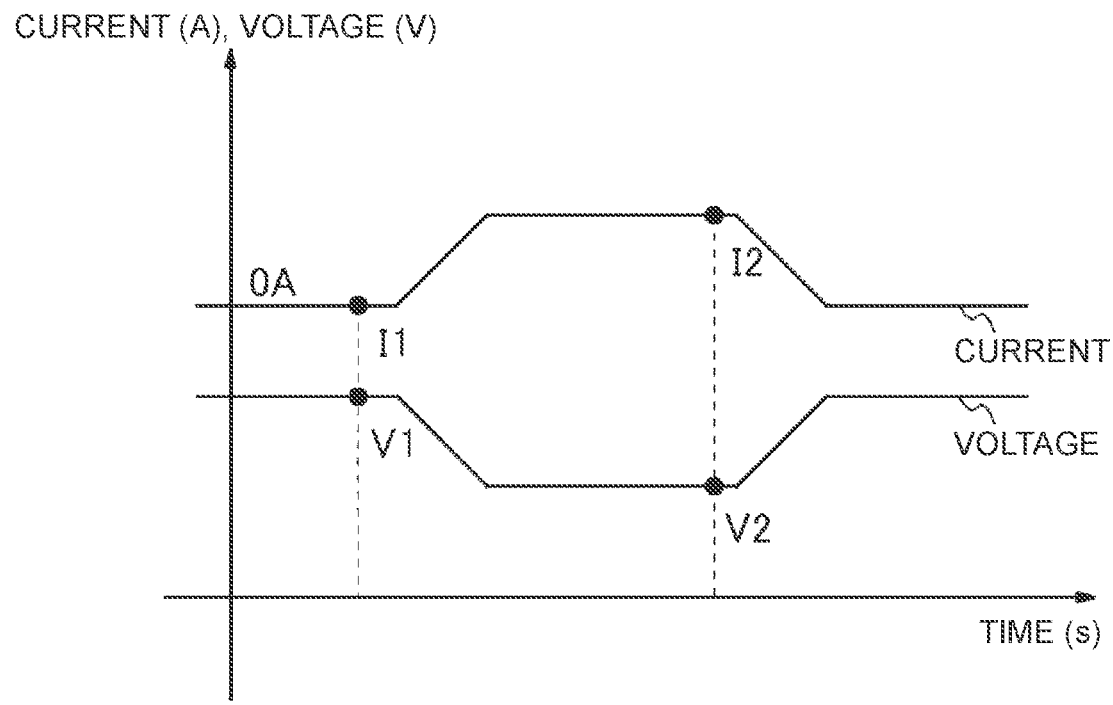
FIG. 7 is a diagram showing an example of a discharge pattern of the battery diagnostic process according to the embodiment.

When the ignition is turned on, the acquisition unit 111 discharges power from the sub-battery 21 as described above. FIG. 7 shows an example of a pattern of a discharge current and a discharge voltage. The acquisition unit 111 measures a current I1 and a voltage V1 before the start of discharge with the current sensor and the voltage sensor. As shown in FIG. 7, the discharge is performed with a constant current and a constant voltage for a certain period of time. The acquisition unit 111 measures the current I2 and the voltage V2 in a state where the discharge current and the discharge voltage are stable.

Step S102

Figure 8:
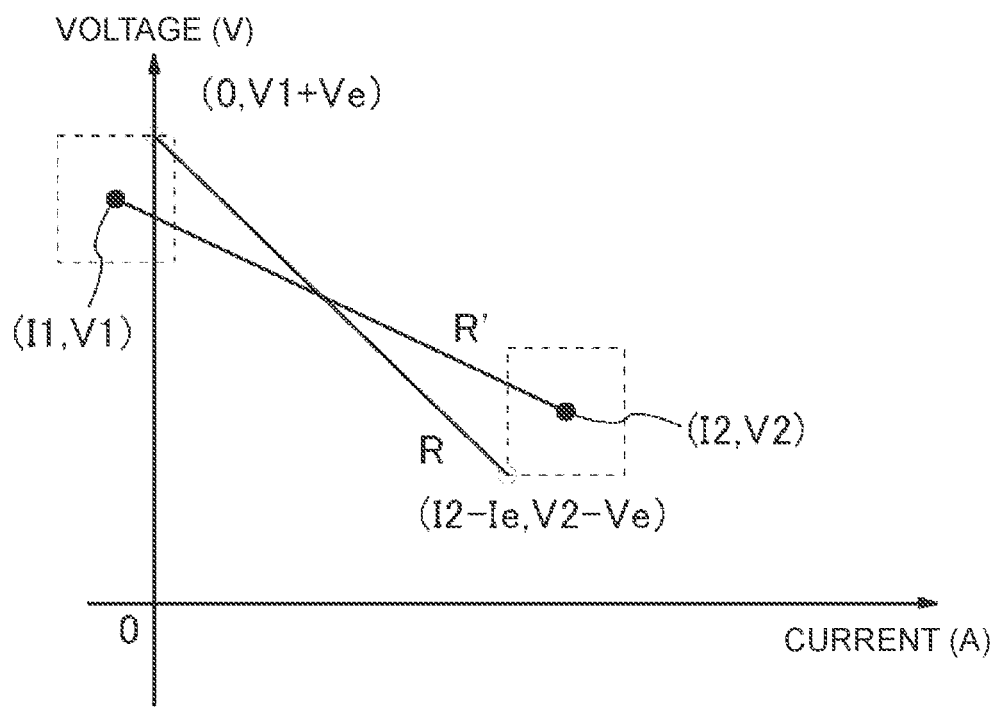
FIG. 8 is a diagram showing an example of a measurement sample according to the embodiment.

The acquisition unit 111 acquires the internal resistance of the sub-battery 21. The internal resistance can be derived based on the current and voltage samples (I1, V1) and (I2, V2) measured at two time points. FIG. 8 shows a graph that maps two samples. If there is no error in the values of the two samples, the internal resistance is the absolute value R' of the inclination of the straight line passing through the two samples in the graph, but the current sensor and the voltage sensor have measurement errors. The true values corresponding to the two samples fall within a range of the measurement error with respect to the sample. In FIG. 8, for example, the ranges surrounded by dotted lines indicate the ranges in which the true value exists for each sample when the current and the voltage respectively have measurement errors of ±Ie and ±Ve. However, since the current I1 is the current before the start of discharge, the true value can be specified as zero.

In general, the larger the internal resistance is, the lower the performance of the sub-battery 21 is. Thus, it is not preferable that the internal resistance is evaluated to be smaller than the true value. In view of this, the maximum value that the internal resistance can take when the current value and the voltage value fall within such a range is derived as the internal resistance to be acquired. In the example shown in FIG. 8, the absolute value of the inclination of the straight line passing through the two points (0, V1+Ve) and (I2−Ie, V2−Ve) is defined as the internal resistance R.

In this way, the acquisition unit 111 corrects the absolute value R' of the rate of change in the voltage with respect to the current when the discharge is performed to a larger value R based on the measurement accuracy of the current and the voltage, and acquires the value of R as the internal resistance. As described above, the corrected internal resistance R may be derived based on the existence range of the true value, and may be derived by multiplying R' by a coefficient α (>1) appropriately determined based on the assumed range of the measured values of the current and the voltage and the measurement accuracy.

Step S103

The acquisition unit 111 acquires the temperature and the state of charge (SOC) of the sub-battery 21. Here, the acquisition unit 111 acquires the measured value of the temperature sensor as the temperature T. Further, the acquisition unit 111 derives an open circuit voltage (OCV) based on the voltage V1 before discharging power from the sub-battery 21, and refers to a map defining in advance the relationship between the OCV and the SOC, and acquires SOC1 that is the SOC corresponding to the derived OCV.

Step S104

The determination unit 112 determines the diagnostic temperature Td, which is the temperature used for the diagnosis, as follows based on the magnitude relationship between the above-mentioned temperature T, the first temperature T1, and the second temperature T2, as illustrated in FIG. 9.

When T≥T1 holds, Td=T1 (S104a).
When T1>T≥T2 holds, Td=T (S104b).
When T2>T holds, Td=T3 (S104c).

Here, T3 represents a third temperature T3 that is lower than the second temperature T2. The third temperature T3 is the guaranteed minimum temperature of the sub-battery 21, which is a temperature substantially low enough that there is no need to assume that the sub-battery 21 functions below this temperature.

As described below, the diagnostic temperature Td can be regarded as the lowest value that the temperature can take in the temperature change pattern of the sub-battery 21 that is assumed based on the temperature T acquired by the acquisition unit 111.

As described above, when the temperature of the sub-battery 21 is lower than T1 and equal to or higher than T2, the temperature is raised by the heater 22 as described above (S104d). Therefore, the following holds.

When T≥T1 holds, even if the temperature of the sub-battery 21 subsequently decreases, the temperature of the sub-battery 21 does not become lower than T1.
When T1>T≥T2 holds, the temperature of the sub-battery 21 is subsequently raised by the heater 22 and does not become lower than T.
When T2>T holds, even if the temperature of the sub-battery 21 subsequently decreases, it is not necessary to assume that the temperature becomes lower than T3, and T3 may be regarded as the minimum value.

Generally, the internal resistance of the sub-battery 21 increases as the temperature decreases. Thus, if the SOC of the sub-battery 21 is the same, the diagnostic temperature Td is a temperature when the internal resistance of the sub-battery 21 becomes the largest while the vehicle is traveling.

In the present embodiment, the determination unit 112 appropriately sets the diagnostic temperature Td in this way based on the temperature T acquired by the acquisition unit 111.

Step S105

The estimation unit 113 estimates the internal resistance of the sub-battery 21 at the diagnostic temperature Td. The estimation is performed by referring to a map defining in advance the relationship between the temperature and the internal resistance, and deriving the internal resistance Rd when the temperature T of the sub-battery 21 acquired by the acquisition unit 111 changes to the diagnostic temperature Td. An example of this map is shown below. Numerical values in the map are omitted as appropriate.

TABLE 1

|  | Internal resistance (mΩ) | | | | |
| --- | --- | --- | --- | --- | --- |
| Temperature (° C.) | ... | ... | ... | ... | ... |
|  | 25 | ... | 1.0 | 1.5 | ... |
|  | ... | ... | ... | ... | ... |
|  | T1 | ... | 4.0 | 6.0 | ... |
|  | ... | ... | ... | ... | ... |
|  | T3 | ... | 15.0 | 22.5 | ... |

When the temperature T of the sub-battery 21 acquired by the acquisition unit 111 is 25° C. and the internal resistance R is 1.0 mΩ, referring to the map, when the diagnostic temperature Td is T1, the internal resistance Rd is 4.0 mΩ. The internal resistance Rd when the diagnostic temperature Td is T3 is 15.0 mΩ.

The internal resistance R may include an error with respect to the true value even when the above correction is performed. For example, assuming that the diagnostic temperature Td is always the guaranteed minimum temperature T3, the error of the internal resistance Rd increases even with a slight error as shown in the map. For example, when the temperature T is 25° C., the error of the internal resistance R is 0.5 mΩ (=1.5 mΩ−1.0 mΩ), but the error of the internal resistance at the temperature T3 is 7.5 mΩ (=22.5 mΩ-15.0 mΩ), and the error increases.

Further, for example, when the diagnostic temperature Td is always the guaranteed minimum temperature T3, the internal resistance of the sub-battery 21 is evaluated larger than necessary in the assumed temperature change pattern of the sub-battery 21.

For example, when the temperature T is 25° C., the temperature will not be lower than the temperature T1, so that the maximum value of the internal resistance can be reliably evaluated with the internal resistance at the temperature T1. Further, when the temperature T is 25° C. and the error of the internal resistance R is 0.5 mΩ (=1.5 mΩ-1.0 mΩ), the error of the internal resistance at the temperature T1 is 2.0 mΩ (=6.0 mΩ-4.0 mΩ), and the error can be further suppressed than that of the internal resistance at the temperature T3.

In the present embodiment, by appropriately setting the diagnostic temperature Td based on the acquired temperature T of the sub-battery 21, the difference between the diagnostic temperature Td and the temperature T can be suppressed, and the internal resistance of the sub-battery 21 can be estimated by suppressing errors and overestimation.

Step S106

The diagnosis unit 114 diagnoses the sub-battery 21 based on the estimated internal resistance Rd. For example, it is diagnosed whether the voltage of the sub-battery 21 can become lower than the voltage Vmin at which quality deterioration occurs. The voltage at which quality deterioration occurs is determined by the product of the permissible lower limit voltage of the cells constituting the sub-battery 21 and the number of serial layers thereof.

The voltage of the sub-battery 21 decreases the most after the measurement by the acquisition unit 111 and when the main power supply system fails while the vehicle is traveling, so that the sub-battery 21 discharges a power amount W required for satisfying the condition for performing limp home control and the subsequent parking lock, and the SOC is reduced from the SOC1 by the amount corresponding to the power amount W. Assuming that the SOC after the decrease is SOCd used for the diagnosis, the OCV in SOCd is OCVd, the internal resistance is Rd', and the current required for performing the parking lock is Id, when Rd' is equal to or lower than Rmax that satisfies the following equation, it can be diagnosed that the voltage of the sub-battery 21 does not become lower than Vmin and the condition imposed on the sub-battery 21 can be satisfied without causing quality deterioration.

$$OCVd - Id \times Rmax = Vmin$$

i.e., $Rmax = (OCVd - Vmin)/Id$

Here, OCVd in SOCd can be acquired by referring to a map defining in advance the relationship between the OCV and the SOC. Further, the internal resistance Rd' in SOCd is acquired by referring to a map defining in advance the relationship between the SOC and the internal resistance and by deriving the change in the internal resistance from Rd in a case where the SOC of the sub-battery 21 acquired by the acquisition unit 111 changes from SOC1 to SOCd. An example of this map is shown below. Numerical values in the map are omitted as appropriate.

TABLE 2

| | | | State of charge (SOC) (%) | | | |
|---|---|---|---|---|---|---|
| | | ... | SOCd | ... | SOC1 | ... |
| Temperature (° C.) | ... | ... | ... | ... | ... | ... |
| | T | ... | R4 | ... | R1 | ... |
| | ... | ... | ... | ... | ... | ... |
| | T1 | ... | R5 | ... | R2 | ... |
| | ... | ... | ... | ... | ... | ... |
| | T3 | ... | R6 | ... | R3 | ... |

This map shows that, for example, at a temperature T, when the SOC is SOC1 and the internal resistance is R1, the internal resistance changes to R4 when the SOC changes to SOCd. Using this map, when the internal resistance is Rd when the SOC is SOC1 at the temperature T, the internal resistance in SOCd is calculated by Rd×R4/R1.

That is, the internal resistance Rd' when the diagnostic temperature Td=T and the SOC is SOCd can be obtained by the following equation.

$$Rd' = Rd \times R4/R1$$

Similarly, the internal resistance Rd' when the diagnostic temperature Td=T1 and the SOC is SOCd can be obtained by the following equation.

$$Rd' = Rd \times R5/R2$$

Similarly, the internal resistance Rd' when the diagnostic temperature Td=T3 and the SOC is SOCd can be obtained by the following equation.

$$Rd' = Rd \times R6/R3$$

When the Rd' obtained in this way is equal to or lower than Rmax, as described above, it can be diagnosed that the voltage of the sub-battery 21 is not lower than Vmin and the condition can be satisfied without causing quality deterioration. If the condition is not satisfied, for example, the user may be notified by a warning light or the like, or even if the main power supply system fails, the vehicle may travel only in a limp home mode and the parking lock may be manually performed by the user.

Effect

As described above, in the battery diagnostic device according to the embodiment of the technique described in the present disclosure, for example, a different diagnostic temperature is determined for each assumed temperature change pattern based on the temperature of the battery to be diagnosed and is used for estimating the internal resistance, which improves the estimation accuracy. This can improve the reliability of battery diagnosis. It should be noted that the technique described in the present disclosure can be applied to cases other than the above embodiment as long as the diagnostic temperature for the current battery temperature can be determined based on at least one of the battery characteristics, control specifications such as charge/discharge and temperature rise/cooling, and usage environment such as ambient air temperature.

Although the embodiment of the technique described in the present disclosure has been described above, the technique described in the present disclosure can be construed as a battery diagnostic device, a battery diagnostic method executed by a battery diagnostic device including a processor and a memory, a battery diagnostic program for executing a battery diagnostic method, a computer-readable non-transitory storage medium that stores a battery diagnostic program, a vehicle control system including a battery diagnostic device, and vehicle equipped with a battery diagnostic device.

INDUSTRIAL AVAILABILITY

The technique described in the present disclosure can be applied to a battery diagnostic device of a vehicle and the like.

What is claimed is:

1. A battery diagnostic device comprising:
an acquisition unit that acquires a temperature and an internal resistance of a battery;
a determination unit that determines a diagnostic temperature that is a temperature used for a diagnosis of the battery, based on the temperature acquired by the acquisition unit;
an estimation unit that estimates the internal resistance of the battery at the diagnostic temperature based on the temperature and the internal resistance acquired by the acquisition unit and the diagnostic temperature determined by the determination unit; and
a diagnosis unit that diagnoses the battery based on the internal resistance estimated by the estimation unit,
wherein the determination unit determines a minimum temperature in a temperature change pattern of the battery that is assumed based on the temperature acquired by the acquisition unit as the diagnostic temperature,
when the temperature of the battery is lower than a first temperature and equal to or higher than a second temperature that is lower than the first temperature, temperature rise control is performed on the battery with heat supplied from an outside, and the determination unit:
- determines the first temperature as the diagnostic temperature when the temperature acquired by the acquisition unit is equal to or higher than the first temperature,
- determines the temperature acquired by the acquisition unit as the diagnostic temperature when the temperature acquired by the acquisition unit is lower than the first temperature and equal to or higher than the second temperature, and
- determines a third temperature that is lower than the second temperature as the diagnostic temperature when the temperature acquired by the acquisition unit is lower than the second temperature.

2. The battery diagnostic device according to claim 1, wherein the acquisition unit acquires a current and a voltage of the battery, corrects an absolute value of a rate of change in the voltage with respect to the current to a larger value based on an acquisition accuracy of the current and an acquisition accuracy of the voltage, and regards the absolute value that has been corrected as an acquired value of the internal resistance.

3. The battery diagnostic device according to claim 1, wherein the acquisition unit further acquires a state of charge of the battery when acquiring the temperature and the internal resistance of the battery, and
the diagnosis unit derives, based on the internal resistance and the state of charge acquired by the acquisition unit, the internal resistance assumed when the battery discharges a power amount specified by a given condition from the state of charge acquired by the acquisition unit, and diagnoses that the battery satisfies the condition when the internal resistance that is derived is equal to or lower than the internal resistance in which the voltage assumed in a case where the battery discharges the power amount with the current specified by the condition is the voltage specified by the condition.

4. A vehicle including the battery diagnostic device according to claim 1.

5. A battery diagnostic method executed by a computer of a battery diagnostic device, the battery diagnostic method comprising:
- an acquisition step of acquiring a temperature and an internal resistance of a battery;
- a determination step of determining a diagnostic temperature that is a temperature used for a diagnosis of the battery, based on the temperature acquired in the acquisition step;
- an estimation step of estimating the internal resistance of the battery at the diagnostic temperature based on the temperature and the internal resistance acquired in the acquisition step and the diagnostic temperature determined in the determination step; and
- a diagnosis step of diagnosing the battery based on the internal resistance estimated in the estimation step, wherein the determination step includes determining a minimum temperature in a temperature change pattern of the battery that is assumed based on the temperature acquired in the acquisition step as the diagnostic temperature,
when the temperature of the battery is lower than a first temperature and equal to or higher than a second temperature that is lower than the first temperature, temperature rise control is performed on the battery with heat supplied from an outside, and
the determination step includes:
- determining the first temperature as the diagnostic temperature when the temperature acquired in the acquisition step is equal to or higher than the first temperature,
- determining the temperature acquired in the acquisition step as the diagnostic temperature when the temperature acquired in the acquisition step is lower than the first temperature and equal to or higher than the second temperature, and
- determining a third temperature that is lower than the second temperature as the diagnostic temperature when the temperature acquired in the acquisition step is lower than the second temperature.

6. A battery diagnostic program executed by a computer of a battery diagnostic device, the battery diagnostic program comprising:
- an acquisition step of acquiring a temperature and an internal resistance of a battery;
- a determination step of determining a diagnostic temperature that is a temperature used for a diagnosis of the battery, based on the temperature acquired in the acquisition step;
- an estimation step of estimating the internal resistance of the battery at the diagnostic temperature based on the temperature and the internal resistance acquired in the acquisition step and the diagnostic temperature determined in the determination step; and
- a diagnosis step of diagnosing the battery based on the internal resistance estimated in the estimation step, wherein the determination step includes determining a minimum temperature in a temperature change pattern of the battery that is assumed based on the temperature acquired in the acquisition step as the diagnostic temperature,
when the temperature of the battery is lower than a first temperature and equal to or higher than a second temperature that is lower than the first temperature, temperature rise control is performed on the battery with heat supplied from an outside, and
the determination step includes:
- determining the first temperature as the diagnostic temperature when the temperature acquired in the acquisition step is equal to or higher than the first temperature,
- determining the temperature acquired in the acquisition step as the diagnostic temperature when the temperature acquired in the acquisition step is lower than the first temperature and equal to or higher than the second temperature, and
- determining a third temperature that is lower than the second temperature as the diagnostic temperature when the temperature acquired in the acquisition step is lower than the second temperature.

* * * * *